United States Patent [19]

Nippert

[11] Patent Number: 4,624,303

[45] Date of Patent: Nov. 25, 1986

[54] HEAT SINK MOUNTING AND METHOD OF MAKING

[75] Inventor: Russell A. Nippert, Delaware, Ohio

[73] Assignee: The Nippert Company, Delaware, Ohio

[21] Appl. No.: 728,303

[22] Filed: Apr. 29, 1985

[51] Int. Cl.$^4$ ............................................. F28F 7/00
[52] U.S. Cl. .................................. 165/80.2; 165/185; 174/52 R; 361/388
[58] Field of Search .................... 165/80.1, 80.2, 80.3, 165/185; 174/52 R, 52 PE, 52 H, 16 HS; 361/386, 388; 29/588, 589, 591

[56] References Cited

U.S. PATENT DOCUMENTS

| | | | |
|---|---|---|---|
| 3,025,435 | 3/1962 | Green | 174/52 |
| 3,033,537 | 5/1982 | Brown, Jr. | 165/80.3 X |
| 3,155,885 | 11/1964 | Marino et al. | 317/234 |
| 3,198,874 | 8/1965 | Dahl | 174/52 |
| 3,252,060 | 5/1966 | Marino et al. | 317/234 |
| 3,374,014 | 3/1968 | Kull et al. | 287/20.3 |
| 3,408,451 | 10/1968 | Redwanz | 174/52 |
| 3,918,625 | 11/1975 | Nippert | 228/136 |
| 4,049,185 | 9/1977 | Nippert | 228/155 |

Primary Examiner—Stephen F. Husar
Attorney, Agent, or Firm—Killworth, Gottman, Hagan & Schaeff

[57] ABSTRACT

A heat sink mounting for a semi-conductor device includes a base member having a base body defining a generally cylindrical recess and a downwardly extending stem portion. The base body further defines an annular groove extending around the side surface of the cylindrical recess. A cap member detachably engages the base member and encloses the cylindrical recess. The cap member includes a tab arrangement which extends radially outward from the bottom of the cylindrical side wall of the cap member to engage the annular groove.

19 Claims, 13 Drawing Figures

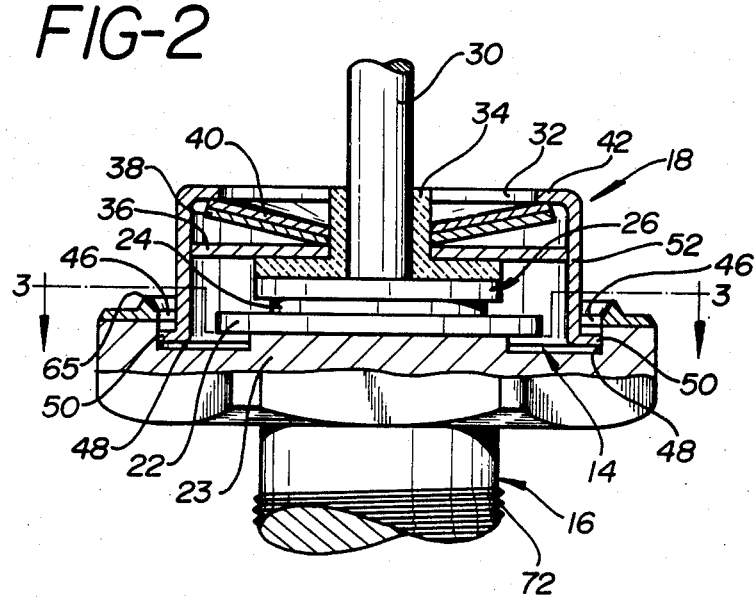
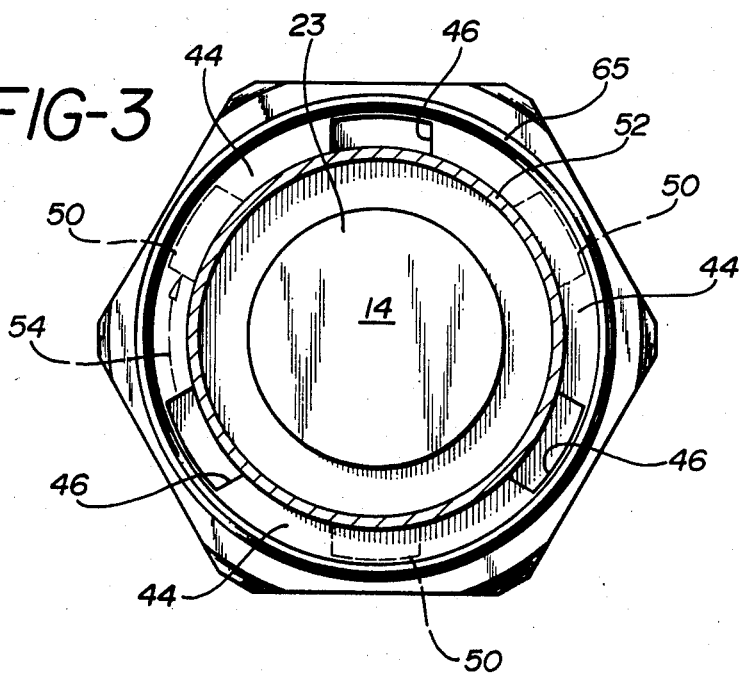

HEAT SINK MOUNTING AND METHOD OF MAKING

BACKGROUND OF THE INVENTION

The present invention relates to a heat sink mounting for a semi-conductor device and to a method of making the mounting. More particularly, the invention contemplates a mounting which can be disassembled for replacement of the semi-conductor device if the device does not meet quality control testing.

Heat sink mountings are commonly provided for semi-conductor devices which carry substantial current loads. High current levels can produce harmful heating of a semi-conductor device unless the heat is properly dissipated. Heat sink mountings of the type to which the present invention is directed, as shown for example in U.S. Pat. No. 4,049,185, issued Sept. 20, 1977, to Nippert, commonly include a base member having a base body for supporting the semi-conductor device on an upper surface and a downwardly extending threaded stem. The mounting is typically attached to a heat sink panel by screwing the stem into a threaded hole in the panel.

The surface upon which the semi-conductor is supported is usually defined within a recess in the top of the base body. Quite often a steel tube surrounds the recess and extends a substantial distance above the top of the base body. This steel tube may be brazed in position, as shown in U.S. Pat. No. 4,049,185, or permanently mechanically joined to the base member, as disclosed in U.S. Pat. Nos. 4,198,874 issued Aug. 3, 1965 to Doll, 3,374,014, issued Mar. 19, 1968 to Kull, and 3,918,625, issued Nov. 11, 1975 to Nippert.

The components of the semi-conductor device, assembled within the steel tube, include a semi-conductor disc, on top of which is positioned a silver disc. A contact disc attached to an upwardly extending contact shaft is positioned on the silver disc. The shaft is surrounded by an electrically non-conductive bushing which, in turn, is pushed downward by means of one or more spring washers. The spring washers are held in place by a spacer washer which is secured to the steel tube in any of several fashions. In one approach, the steel tube is crimped slightly above the washer to prevent upward movement in the tube. In another approach, tabs are punched from the side wall of the steel tube and bent inward to contact the top of the spring washer, thereby holding all of the component parts together.

After the various parts are assembled, the device is tested. If a device does not pass the inspection test, it is necessary to throw away the mounting elements along with the defective semi-conductor disc with most prior art heat sink mountings. This results in unacceptably high scrap costs, however, since the high conductivity copper from which a typical base member is formed is relatively expensive.

U.S. Pat. No. 3,025,435, issued Mar. 13, 1962, to Green discloses a heat sink mounting which includes a base member and a cylindrical tube portion. The exterior of the lower end of the tube portion and the interior of the base member recess are threaded such that the heat sink mounting may be taken apart for repair if the semi-conductor element does not operate properly. While offering the advantage that it can be disassembled, the heat sink mounting structure of the Green U.S. Pat. No. 3,025,435 requires the somewhat difficult and time consuming operation of machining threads on the elements to be joined.

Accordingly, it is seen that there is a need for a simple heat sink mounting structure for a semi-conductor device, which structure may be disassembled to permit replacement of a defective semi-conductor element.

SUMMARY OF THE INVENTION

The heat sink mounting according to the present invention for a semi-conductor device comprises a base member and a cap member. The base member includes a base body, defining a generally cylindrical recess in its upper surface, and a downwardly extending stem portion. The base body further includes a plurality of inwardly extending flanges which are spaced around the opening of the cylindrical recess and which define open areas therebetween. The cap member has a substantially cylindrical side wall and a plurality of tabs extending radially outward from the bottom of the cylindrical side wall. The tabs are sized and spaced around the side wall in corrspondence to the size and spacing of the open areas between the flanges. The heat sink mounting may be assembled by first inserting the bottom of the cap member into the cylindrical recess with the tabs aligned with the open areas so as to pass therethrough. Then, the cap member is rotated such that the tabs are positioned beneath the flanges.

The bottom of the cylindrical recess may define a raised pedestal surface in the center of the recess. The base body may include an annular ridge surrounding the opening of the cylindrical recess.

The base body may define an annular groove in the side surface of the cylindrical recess beneath the inwardly extending flanges. The tabs are held in the annular groove beneath the flanges. The cap member may define an upper portion extending radially inward from the top of the cylindrical side wall. Alternatively the cap member may be substantially open at its upper end.

The heat sink mounting may comprise a base member including a base body, defining a generally cylindrical recess in its upper surface, and a downwardly extending stem portion. The base body further defines an annular groove extending around the side surface of the cylindrical recess, and tube means for detachably engaging the base member and enclosing the cylindrical recess. The tube means has a substantially cylindrical side wall. Further, the tube means includes tab means extending radially outward from the bottom of the cylindrical side wall for engaging the annular groove and holding the tube means in the recess.

The tube means may include an upper portion which extends radially inward, defining a central hole for receiving a contact of the semi-conductor device. Alternatively, the tube means may be substantially open at its upper end.

The tube means may define a slot extending axially along the side wall completely therethrough. The outer diameter of the tube means may be reduced by forcing the sides of the slot toward each other, thereby permitting the tube means to be inserted into the recess and the annular groove to be engaged by the tab means.

The tab means may comprise a plurality of spring arms extending generally downward along the side wall and a plurality of tabs. Each such tab extends radially outward from an assorted one of the spring arms, whereby the spring arms may be flexed radially inward to permit the tube means to be inserted into the recess such that the annular groove is engaged by the plurality of tabs.

The base member may define a plurality of notches spaced around the opening to the recess. Each notch descends downward along the side surface of the recess to the annular groove. The tab means comprises a plurality of tabs extending radially outward from the bottom of the cylindrical side wall of the tube means. The tabs are sized and spaced in correspondence to the notches. The heat sink mounting may be assembled by first inserting the bottom of the tube means into the cylindrical recess, with the tabs aligned with the notches so as to pass downward therealong to the annular groove. The tube means is then axially rotated such that the tabs are positioned in the groove, but out of alignment with the notches.

A method of making a heat sink mounting for a semiconductor device, including a high conductivity copper base member and a cap member detachably mounted thereon, in which the cap member has a cylindrical side wall and tab means extending radially outward from the bottom of the cylindrical side wall, comprises the steps of:

(a) forming a copper billet having an upper locating recess of reduced diameter;
(b) brazing a steel ring on the copper billet in the upper locating recess;
(c) extruding the copper billet and the steel ring to form a base member having a base body defining a generally cylindrical recess and a downwardly extending stem portion;
(d) machining the interior of the cylindrical recess to provide an annular groove extending around the side surface of the cylindrical recess; and
(e) securing the cap member to the base member by inserting the cap member in the cylindrical recess with the tab means positioned in the annular groove.

The cap member may define a slot extending axially along the side wall completely therethrough and the step of securing the cap member to the base member may include the steps of:

(a) reducing the outer diameter of the cap member by forcing the sides of the slot toward each other;
(b) inserting the cap member into the cylindrical recess; and
(c) releasing the cap member to permit the cap member to increase in diameter such that the tab means engages the annular groove.

The tab means may comprise a plurality of spring arms extending generally downward along the side wall and a plurality of tabs, each such tab extending radially outward from an associated one of the spring arms. The step of securing the cap member to the base member includes the steps of flexing the spring arms radially inward, inserting the cap member into the cylindrical recess, and releasing the spring arms to permit the tabs to move radially outward and engage the annular groove.

The steel ring may define a plurality of notches spaced around its inner diameter, and the step of extruding the copper billet and the steel ring may include the step of extruding the billet to define a plurality of notches spaced around the cylindrical opening and descending downward along the side surface of the recess. The step of machining the interior of the cylindrical recess may include the step of machining the annular groove around the surface such that the annular groove communicates with the notches.

The tab means may comprise a plurality of tabs extending radially outward from the bottom of the cylindrical side wall and the step of securing the cap member to the base member may include the steps of inserting the bottom of the cap member into the cylindrical recess with each of the tabs passing downward along a respective one of the notches to the annular groove, and rotating the cap member such that the tabs are then positioned in the groove, but out of alignment with the notches. The step of machining the interior of the cylindrical recess may include the step of machining the bottom of the recess to provide a raised pedestal surface in the center of the cylindrical recess.

Accordingly, is is an object of the present invention to provide a heat sink mounting and a method of making the mounting in which the cap member of the mounting may be detached from the base member after assembly thereto in the event that the semi-conductor element is defective; to provide such a mounting and method of making the mounting in which the base member includes a base body defining a generally cylindrical recess and an annular groove extending around the side surface of the recess, and in which the tube means includes tab means extending radially outward from the bottom of the cylindrical side wall of the tube means for engaging the annular groove; to provide such a mounting and method of making the mounting in which the tube means defines a slot extending axially along the side wall and completely therethrough, to permit the diameter of the tube means to be reduce by forcing the sides of the slot toward each other during insertion of the tube means into the recess; to provide such a mounting and method of making the mounting in which the tab means includes a plurality of spring arms having tabs extending radially outward, such that the spring arms may be flexed radially inward during insertion of the tube means into the recess; and to provide such a heat sink mounting and method of making the mounting in which the base member defines a plurality of notches spaced around the opening, descending downward along a side surface of the recess and the tab means comprises a plurality of tabs extending radially outward from the bottom of the cylindrical side wall of the tube means, which tabs are sized and space in correspondence to the notches to permit them to move downward along the notches to the annular groove prior to rotation of the tube means.

Other objects and advantages of the invention will be apparent from the following description, the accompanying drawings and the appended claims.

BRIEF DESCRIPTION OF THE DRAWINGS

FIG. 2 is a sectional view taken generally along line 2—2 in FIG. 1;

FIG. 3 is a sectional view taken generally along 3—3 in FIG. 2;

DETAILED DESCRIPTION OF THE PREFERRED EMBODIMENTS

Figure 1:
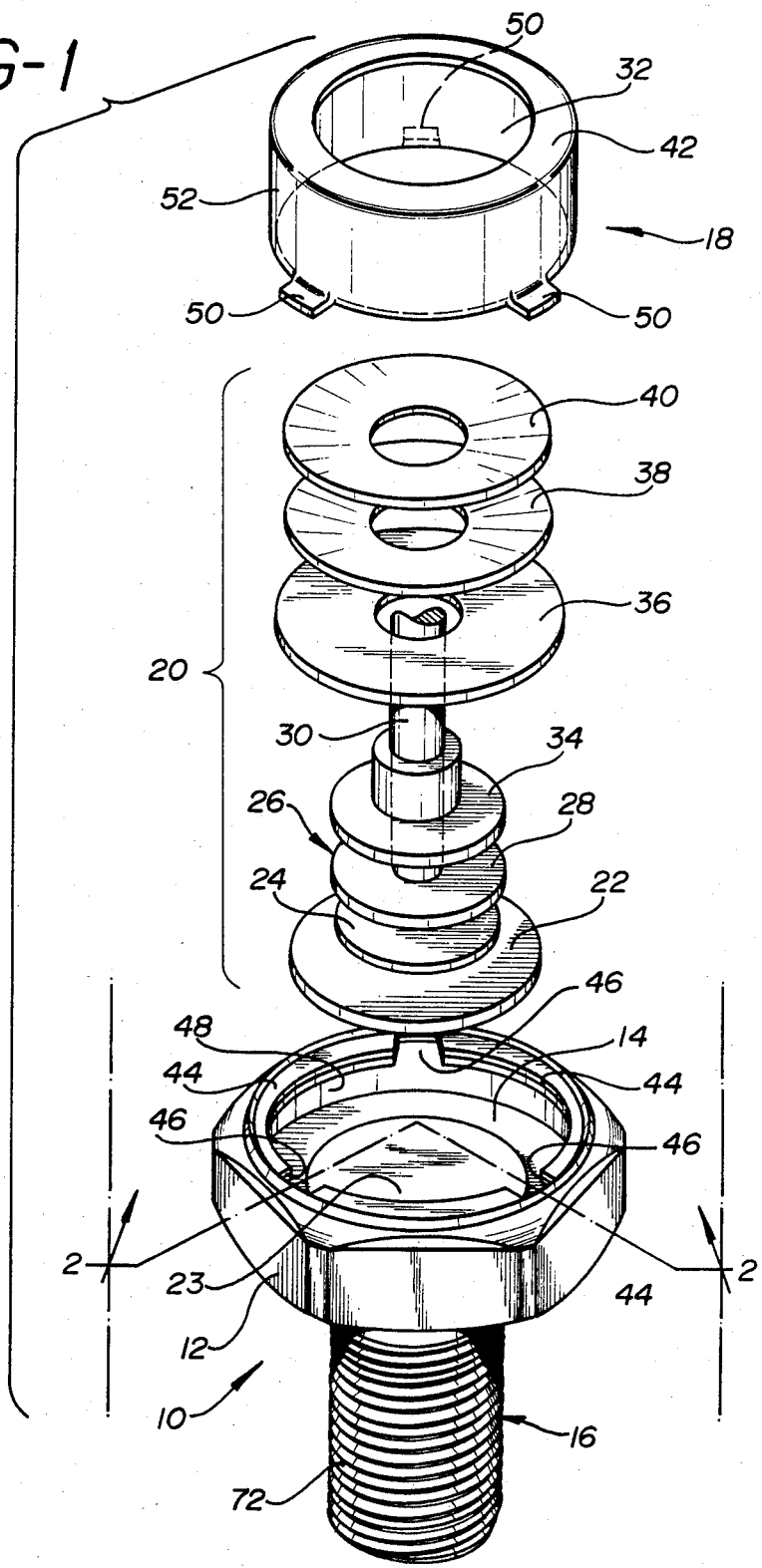
FIG. 1 is an exploded perspective view of a heat sink mounting, constructed according to the present invention, including a semi-conductor device and associated elements.

Reference is made to FIGS. 1–3 which illustrate a first embodiment of a heat sink mounting for a semi-conductor device, constructed according to the present invention. The mounting includes a base member 10, having a base body 12 defining a generally cylindrical recess 14 in the upper surface of the base body. The base member also has a downwardly extending stem portion 16 which typically is threaded. The stem portion 16 of the heat sink mounting can be screwed into a thermally conductive heat sink support and the body 12 is hexagonal in shape to facilitate this operation. The heat sink mounting further includes a tube means comprising a cap member 18 for detachably engaging the base member 10 and enclosing the cylindrical recess 14. Preferably, the base member 10 is formed of a high conductivity copper material and the cap member 18 made of steel. Other materials may, however, also be used.

The heat sink mounting contains a plurality of elements 20 which are stacked within the recess 14, as shown in FIG. 2, and which collectively make up the semi-conductor device. A disc of semi-conductor material 22 is positioned on a raised pedestal surface 24, generally located in the center of the bottom of recess 14. The surface 24 makes electrical contact with one side of the disc 22. The base body 12 therefore is included in the electrical circuit utilizing the semi-conductor device. The opposite side of the semi-conductor disc 22 is contacted by a silver disc 24 which, in turn, is contacted by a contact member 26. Contact member 26 includes a lower disc portion 28 and a contact shaft 30 extending upward through a central hole 32 in the cap member 18.

Positioned on the shaft 30 is a bushing 34, made of a ceramic or similar electrically nonconductive material. Bushing 34 keeps the contact member 26 out of electrical contact with a flat washer 36. As best seen in FIG. 2, washer 36 contacts the outer surface of insulating bushing 34 and the inner surface of the cap member 18, holding the elements 20 centrally within the heat sink mounting. Pressing downward on the washer 36 are a pair of spring washers 38 and 40 which are also in contact with an upper portion 42 of the cap member 18. Washers 38 and 40 press the stacked elements 20 of the semi-conductor device together, maintaining all of the elements in good electrical contact with each other, while at the same time allowing for dimensional variations which may occur as the semi-conductor device is operated and the elements 20 are heated above ambient temperature.

The base body in the embodiment of FIGS. 1–3 has a plurality of inwardly extending flanges 44 which define therebetween a plurality of notches or open areas 46. Each of the notches 46 descends downward along the side surface of the recess 14 to an annular groove 48 which is defined beneath the flanges 44. The cap member 18 includes a plurality of tabs 50 extending radially outward from the bottom of the cylindrical side wall 52 of the cap member. These tabs are sized and spaced in correspondence to the sizing and spacing of the notches 46. The device is assembled by stacking the elements 20 in the recess 14, and then inserting the bottom of cap 18 into the cylindrical recess 14 with the tabs aligned with the notches. The tabs pass downward through the notches to the annular groove 48. Next, the cap member 18 is axially rotated, as indicated by arrow 54 in FIG. 3, such that the tabs 50 are positioned in groove 48 out of alignment with notches 46. The spring washers 38 and 40 maintain a spring force on the cap member 18, holding the upper surfaces of the tabs 40 in contact with bottom surfaces of the flanges 44.

The heat sink mounting of the present invention is advantageous in that it permits the elements 20 of the semi-conductor device to be assembled in the mounting and subjected to quality control testing, while also permitting the replacement of the disc 22 should it prove to be defective. It will be appreciated that the high conductivity copper of the base member is relatively expensive. The heat sink mounting of the present invention therefore provides substantial savings by reducing the number of such mountings which are scrapped.

Figure 4A:
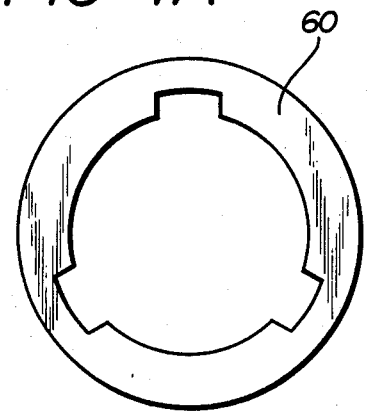
FIG. 4A is a plan view of a steel ring used in making the heat sink mounting of the present invention.
Figure 4B:
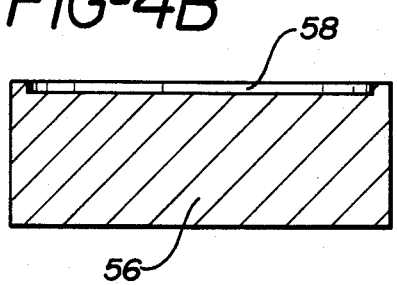
FIG. 4B is a sectional view taken through a cylindrical copper billet used in making the heat sink mounting of the present invention.
Figure 4C:
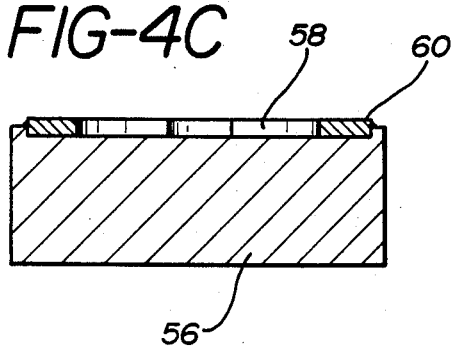
FIG. 4C is a sectional view illustrating the steel ring brazed onto the top of the copper billet.

FIGS. 4A–4E illustrate the method by which the heat sink mounting of the present invention is made. A cylindrical copper billet 56, shown in FIG. 4B, is formed having an upper locating recess 58 of reduced diameter and approximately 0.02 inches in depth. A steel ring 60, shown in FIG. 4A, is provided having a central opening pattern which corresponds generally to the pattern defined by the flanges 44 and the spaces 46 of the base body. The steel ring 60 is substantially thicker than the depth of recess 58, on the order of 0.040 to 0.050 inch. Steel ring 60 is brazed onto the copper billet 56 in the upper locating recess 58, as shown in FIG. 4C.

Figure 4D:
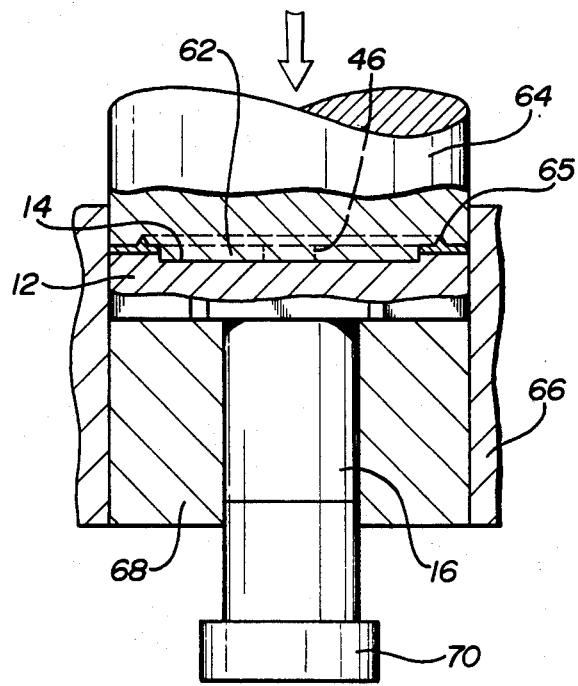
FIG. 4D is a sectional view illustrating extrusion of the cylindrical copper billet and the steel ring to form a base member of the heat sink mounting.
Figure 4E:
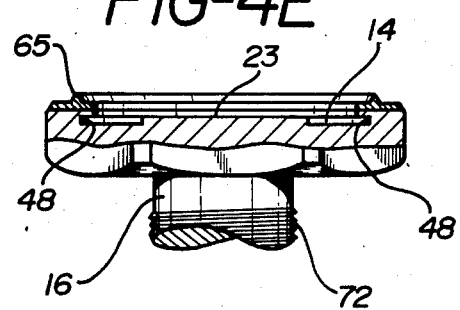
FIG. 4E is a partial sectional view of the base member after extrusion and machining.

Next, the copper billet 56 and the steel ring 60 are extruded, as shown in FIG. 4D, to form a base member having a base body 12 defining a generally cylindrical recess 14 and a downwardly extending stem portion 16. The extrusion process forms the hexagonal outer shape of the body 12 from the substantially cylindrical billet 56. The lower part 62 of the upper die element 64 is configured in a shape corresponding to that of the opening in the steel ring 60 shown in FIG. 4A. As a consequence, as it presses downward forming part of the recess 14, it also forms the notches 46 in the recess 14. During the extrusion process, the annular ridge 65 is also formed in the upper surface of the base body 12, surrounding the recess 14. This annular ridge is formed from the steel material of ring 60 and, as is known, is used to weld an outer cover element onto the base member. Next, the upper die portion 64 is raised and the base member 10 is ejected from the lower die elements 66 and 68 by ejection pin 70. As seen in FIG. 4E, the bottom of the recess 14 is then machined to produce the groove 48 in the side surface of the recess 14 and the pedestal surface 24. Additionally, threads 72 are roll formed and/or machined onto the stem portion 16 of the base body 10.

Figure 5:
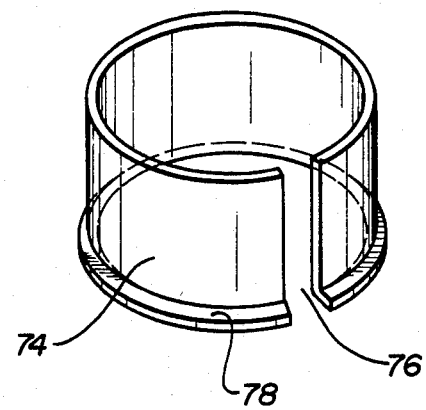
FIG. 5 is a perspective view of an alternative embodiment of the tube means.

FIG. 5 illustrates an alternative construction for the tube means. It should be noted that the cap member 74 is completely open at its upper end and does not define an inwardly extending upper portion, such as portion 42 shown in FIG. 1. When using the cap member 74 of FIG. 5, the side walls of the cap member 74 are punched or crimped after the elements 20 are stacked in the recess 14 so as to engage the top of the spring washers 38 and 40 and hold the elements together in compression.

Although requiring this additional assembly operation, the cap member 74 of FIG. 5 detachably engages the base member of the heat sink mounting. The base member used with the cap member 74 of FIG. 5 need not have the notches 46 shown in FIG. 1. Rather, in order to permit the cap member 74 to be inserted into the recess 14 of the base body, the cap member 74 is reduced in diameter by forcing the sides of slot 76 toward each other. The diameter of flange 78 is therefore reduced such that it is less than the inner diameter of the recess 14. The cap member 74 is inserted into the recess 14 and released. The cap member 74 then expands outward toward its noncompressed shape, with the flange 78 seating itself in the annular groove 48 of the base body.

Figure 6:
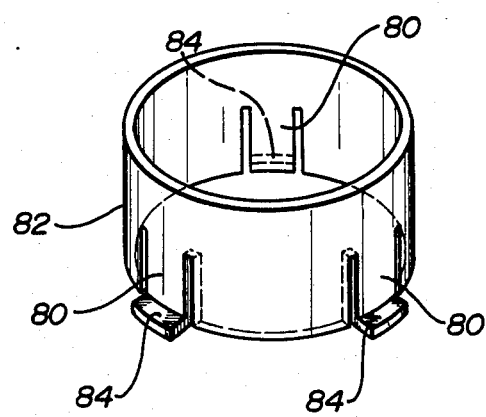
FIG. 6 is a perspective view of a further embodiment of the tube means.

FIG. 6 illustrates yet another version of the tube means for the heat sink mounting. The tab means comprises a plurality of spring arms 80 which extend generally downward along the side wall 82, and a plurality of tabs 84 which extend radially outward from associated ones of the spring arms. The spring arm 80 may be flexed radially inward to permit the tube means to be inserted in the recess 14 of a base member. The arms 80 then move outward as the tabs 84 snap into the annular groove 48 in the base body. As with the tube means of FIG. 5, the side wall 82 is punched or crimped after the elements 20 are stacked in the recess 14 so as to engage the top of the spring washers 38 and 40 and hold the elements together in compression.

It will be apparent that the construction of the cap members shown in FIGS. 5 and 6 provides for ready disassembly of the heat sink mounting by removal of the cap member from the base member, should the semi-conductor device fail the requisite quality control testing. To perform this operation, the punched or crimped portions of the tube member are bent back and the elements 20 are removed. The tube member is then removed from the base member. It will be appreciated that the tube member is destroyed by this demounting operation, but the base member and most of the elements 20 may be reused.

It will be appreciated that while the cap members of FIGS. 5 and 6 are shown with open upper ends, such members could be constructed with an inwardly extending portion, similar to portion 42 in FIG. 1. Further, while the configuration of the cap members of FIGS. 5 and 6 is such that notches 46 are not required for their insertion into a base member body, nevertheless, these cap members could be used in conjunction with base members having such notches.

Figure 7:
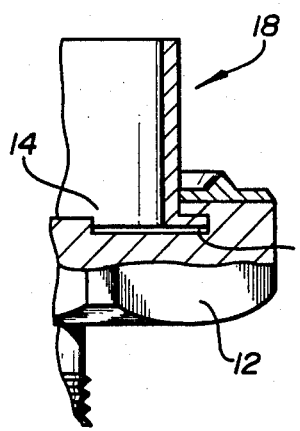
FIG. 7 is a partial sectional view of the base member with a tube member secured thereon.
Figure 8:
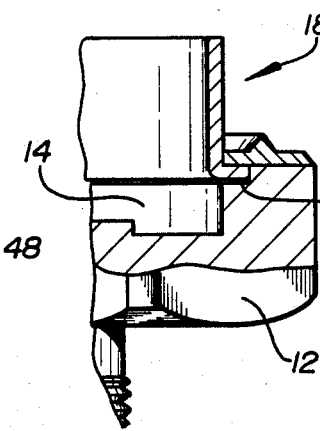
FIG. 8 is a partial sectional view of another embodiment of the base member, with a tube member secured thereon.
Figure 9:
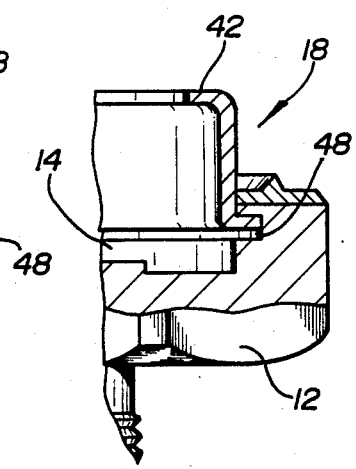
FIG. 9 is a partial sectional view of yet another base member, with a tube member secured thereon.

It will be appreciated that various modifications may be in the shape of the base member and the position of annular groove in the side surface. The base body 12 of FIG. 7 includes an annular groove which is positioned at the bottom of the recess 14. The base body is relatively thin and has a relatively long tube means 18 mounted thereon. In contrast, base body 12 of FIG. 8 is substantially thicker and, due to the positioning of annular groove 48 near the top of the recess 14, requires a much shorter tube means 18. The base member 12 and the tube means 18 of the heat sink mounting of FIG. 8 provide the same amount of interior space for the elements of the semi-conductor device as is provided by the mounting of FIG. 7. The base body 12 of FIG. 9, on the other hand, has its annular groove 48 positioned intermediate the bottom of the recess 14 and the top of the recess 14. Due to the fact that the semi-conductor components 20 are held within the heat sink mounting by the inwardly extending portion 42, the tube means 18 need not extend upward as far as would be required if the tube means were completely open at its upper end.

Having described the invention in detail and by reference to preferred embodiments thereof, it will be apparent that modifications and variations are possible without departing from the scope of the invention defined in the appended claims.

What is claimed is:

1. A heat sink mounting for a semi-conductor device, comprising:
   a base member, including a base body defining a generally cylindrical recess in its upper surface and a downwardly extending stem portion, said base body further including a plurality of inwardly extending flanges spaced around the opening of said cylindrical recess and defining open areas therebetween, and
   a cap member having a substantially cylindrical side wall and a plurality of tabs extending radially outward from the bottom of said cylindrical side wall, said tabs being sized and spaced around said side wall in correspondence to the size and spacing of said open areas between said flanges, whereby said heat sink mounting may be assembled by first inserting the bottom of said cap member into said cylindrical recess with said tabs aligned with said open areas so as to pass therethrough, and then rotating said cap member such that said tabs are positioned beneath said flanges.

2. The heat sink mounting of claim 1 in which the bottom of said cylindrical recess defines a raised pedestal surface in the center of said recess.

3. The heat sink mounting of claim 1 in which said base body includes an annular ridge surrounding the opening of said cylindrical recess.

4. The heat sink mounting of claim 1 in which said base body defines an annular groove in the side surface of said cylindrical recess beneath said inwardly extending flanges, whereby said tabs are held in said annular groove beneath said flanges.

5. The heat sink mounting of claim 1 in which said cap member defines an upper portion extending radially inward from the top of said cylindrical side wall.

6. The heat sink mounting of claim 1 in which said cap member is substantially open at its upper end.

7. A heat sink mounting for a semi-conductor device, comprising:
   a base member, including a base body defining a generally cylindrical recess in its upper surface and a downwardly extending stem portion, said base body further defining an annular groove extending around the side surface of said cylindrical recess, and
   tube means for detachably enagaging said base member and enclosing said cylindrical recess, said tube means, having a substantially cylindrical side wall, and tab means extending radially outward from the bottom of said cylindrical side wall for engaging said annular groove and holding said tube means in said cylindrical recess.

8. The heat sink mounting of claim 7 in which said tube means includes an upper portion which extends radially inward and which defines a central hole for receiving a contact of said semi-conductor device.

9. The heat sink mounting of claim 7 in which said tube means is substantially open at its upper end.

10. The heat sink mounting of claim 7 in which said tube means defines a slot extending axially along said side wall completely therethrough, whereby the outer diameter of said tube means may be reduced by forcing the sides of said slot toward each other, thereby permitting said tube means to be inserted into said recess and said annular groove to be engaged by said tab means.

11. The heat sink mounting of claim 7 which said tab means comprises a plurality of spring arms extending generally downward along said side wall, and a plurality of tabs, each such tab extending radially outward from an associated one of said spring arms, whereby said spring arms may be flexed radially inward to permit said tube means to be inserted into said recess such that said annular groove is engaged by said plurality of tabs.

12. The heat sink mounting of claim 7 in which said base member includes an annular ridge surrounding the opening of said cylindrical recess.

13. The heat sink mounting of claim 7 in which
said base member defines a plurality of notches spaced around the opening to said recess, each notch descending downward along the side surface of said recess to said annular groove, and
said tab means comprises a plurality of tabs extending radially outward from the bottom of said cylindrical side wall of said tube means, said tabs being sized and spaced in correspondence to said notches, whereby said heat sink mounting may be assembled by first inserting the bottom of said tube means into said cylindrical recess with said tabs aligned with said notches so as to pass downward therealong to said annular groove, and then axially rotating said tube means such that said tabs are positioned in said groove out of alignment with said notches.

14. A method of making a heat sink mounting for a semi-conductor device, said mounting including a high conductivity copper base member and a cap member detachably mounted thereon, said cap member having a cylindrical side wall and tab means extending radially outward from the bottom of said cylindrical side wall, comprising the steps of:
forming a copper billet having an upper locating recess of reduced diameter,
brazing a steel ring on said copper billet in said upper locating recess,
extruding said copper billet and said steel ring to form a base member having a base body defining a generally cylindrical recess and a downwardly extending stem portion.
machining the interior of said cylindrical recess to provide an annular groove extending around the side surface of said cylindrical recess, and
securing said cap member to said base member by inserting said cap member in said cylindrical recess with said tab means positioned in said annular groove.

15. The method of claim 14 in which said cap member defines a slot extending axially along said side wall completely therethrough and in which the step of securing said cap member to said base member includes the steps of:
reducing the outer diameter of said cap member by forcing the sides of said slot toward each other,
inserting said cap member into said cylindrical recess, and
releasing said cap member to permit said cap member to increase in diameter such that said tab means engages said annular groove.

16. The method of claim 14 in which said tab means comprises a plurality of spring arms extending generally downward along said side wall and a plurality of tabs, each such tab extending radially outward from an associated one of said spring arms, and in which the step of securing said cap member to said base member includes the steps of:
flexing said spring arms radially inward,
inserting said cap member into said cylindrical recess, and
releasing said spring arms to permit said tabs to move radially outward and to engage said annular groove.

17. The method of claim 14 in which said steel ring defines a plurality of notches spaced around its inner diameter, in which the step of extruding said copper billet and said steel ring includes the step of extruding said billet to define a plurality of notches spaced around said cylindrical opening and descending downward along the side surface of said recess, and in which the step of machining the interior of said cylindrical recess includes the step of machining said annular groove around said side surface such that said annular groove communicates with said notches.

18. The method of claim 17 in which said tab means comprises a plurality of tabs extending radially outward from the bottom of said cylindrical side wall, and in which step of securing said cap member to said base member includes the steps of:
inserting the bottom of said cap member into said cylindrical recess with said tabs passing downward along said notches to said annular groove, and
rotating said cap member such that said tabs are positioned in said groove out of alignment with said notches.

19. The method of claim 14 in which the step of machining the interior of said cylindrical recess includes the step of machining the bottom of said recess to provide a raised pedestal surface in the center of said cylindrical recess.

* * * * *